United States Patent [19]

Meinzer

[11] Patent Number: 5,017,888
[45] Date of Patent: May 21, 1991

[54] BROADBAND NONLINEAR DRIVE CONTROL NETWORK FOR LINEAR AMPLIFIERS ARRANGED IN SEVERAL AMPLIFIER CHANNELS

[75] Inventor: Karl Meinzer, Marburg, Fed. Rep. of Germany

[73] Assignee: Messerschmitt-Boelkow-Blohm GmbH, Munich, Fed. Rep. of Germany

[21] Appl. No.: 486,951

[22] Filed: Mar. 1, 1990

[30] Foreign Application Priority Data

Mar. 1, 1989 [DE] Fed. Rep. of Germany ....... 3906448

[51] Int. Cl.$^5$ .............................................. H03P 3/68
[52] U.S. Cl. .................................. 330/295; 330/124 R
[58] Field of Search ................. 307/540; 330/84, 909, 330/124 D, 124 R, 284, 295, 302; 333/124

[56] References Cited

U.S. PATENT DOCUMENTS 4,494,084 1/1985 Hughes .......................... 307/540 X
4,780,685 10/1988 Ferguson ........................ 330/295 X

FOREIGN PATENT DOCUMENTS 759851 12/1939 Fed. Rep. of Germany .

OTHER PUBLICATIONS

H. Chireix: High Power Outphasing Modulation Proc. I.R.E., V.23, No. 11 (Nov. 1935) pp. 1370–1392.
W. H. Doherty: "A New High Efficiency Power Amplifier for Modulated Waves", Proc. I.R.E. V. 24, No. 9 (Sep. 1936) pp. 1163–1182.

Primary Examiner—Steven Mottola
Attorney, Agent, or Firm—W. G. Fasse; D. H. Kane, Jr.

[57] ABSTRACT

A broadband nonlinear drive control network for linear amplifiers with several amplifier channels has a first branch (Z1) with an adjustable amplitude limiter (A) connected to a signal source (S) through an impedance inverter (B), whereby an increasing impedance is produced at the signal source (S) when the limiter is activated. A variable resistor (C) is connected to the signal source (S) in a second branch (Z2). The resistor (C) begins to conduct only above an adjustable high frequency signal voltage. The amplitudes at the limiter (A) and at the resistor are tuned to each other so that the load impedance at the signal source (S) remains constant. Linear branch signal combinations provide the drive control voltages for the individual channels (K2 . . . Kn). A portion of the power output of the branch (Z1) directly drives the amplifier channel (K1).

4 Claims, 5 Drawing Sheets

BROADBAND NONLINEAR DRIVE CONTROL NETWORK FOR LINEAR AMPLIFIERS ARRANGED IN SEVERAL AMPLIFIER CHANNELS

FIELD OF THE INVENTION

The invention relates to a broadband nonlinear drive control network for linear amplifiers, especially transmitter amplifiers arranged in several parallel amplifier channels.

BACKGROUND INFORMATION

Multi-channel, high gain linear amplifiers for transmitters are described, for example, in the above cross-referenced patent application corresponding to German Patent Publication P 3,733,374. Such amplifiers require a network which provides a drive control signal with the appropriate amplitude and phase characteristics for each individual channel. The amplifier channels require different input signals dependent on the momentary modulation signal. Therefore, the network must realize a nonlinear transfer function. Moreover, the network must have a sufficient broadband characteristic so that the band width of the entire system is not limited by the network. Furthermore, the losses in the network should not be too large. The feedback due to dynamic matching variations should be small, and costs should be as low as possible. There is room for improvement in these respects.

Previously, multi-channel transmitters have been realized only in conjunction with modulated transmitter amplifiers as described, for example, in H. Chireix High Power Outphasing Modulation Proc. I.R.E., Volume 23, No. 11, (November, 1935), pages 1370-1392, and W. H. Doherty: "A New High Efficiency Power Amplifier for Modulated Waves", Proc. I.R.E., Volume 24, No. 9, (September, 1936), pages 1163-1182. In connection with such modulated amplifiers, the envelope curve of the modulated signal is explicitly at hand, so that it is immediately possible to realize the necessary control voltages as a function of the envelope curve using suitable circuit components, for example, capacitive diodes. However, the conventional method cannot be used for broadband linear amplifiers because the envelope curve signal has a band width which is a multiple of the amplifier band width. Thus, in that case, an explicit processing of the envelope curve would unallowably limit the band width of the amplifier.

This problem led, early on, to attempts to solve it by synthesizing the drive control voltages without manipulating the envelope curve signal. The only known successful solution to that problem is described by J. Fagot and H. Chireix (French Radio Electric Society) German Patent (DRP) 759,851, Dec. 3, 1939. The described solution uses a high frequency (HF) negative feedback path for generating the drive control voltages.

However, in the typical modern multi-stage semiconductor amplifiers or in high gain microwave tubes, the known method is not practical because the transit time in the amplifiers leads to instabilities. Besides, the known method achieves an insufficient band width.

OBJECTS OF THE INVENTION

In view of the above it is the aim of the invention to achieve the following objects singly or in combination:
to construct a drive control network for a linear amplifier system, whereby the network operates nonlinearly over a broadband width for controlling multi-channel transmitters, while avoiding the above outlined drawbacks of the prior art;
to generate appropriate drive control signals in such a control network without explicitly processing the envelope curve of the signal;
to reduce the number of circuit components required for such drive circuits as compared to respective conventional circuits;
to avoid negative feedback paths in such a drive control network; and
to achieve a higher signal stability with a reduced temperature dependence in such a control network.

SUMMARY OF THE INVENTION

The above objects have been achieved according to the invention in a broadband nonlinear drive control network for linear amplifiers arranged in several channels, wherein said network comprises several branches, an amplitude adjustable amplitude limiter in a first branch of the network, whereby the limiter is connected to a signal source through an impedance inverter, so that an increasing impedance is produced at the signal source when the limiter is activated. A resistor is connected to the signal source. The resistor begins to conduct only above a prescribed, adjustable HF voltage. This resistor or its resistance is coupled in a second branch of the network with a constant load impedance, whereby the amplitude at the limiter and the amplitude at the onset of conductivity of the resistance are adjusted or tuned to each other, so that the conductance or admittance at the signal source which has been reduced by the activation of the limiter, is compensated by the variable conductivity of the resistance, so that the load for the signal source remains constant. In this arrangement the first branch of the nonlinear network generates a signal which is limited above a prescribed amplitude and which does not comprise any phase-frequency characteristic. In other words, the amplitude limiter keeps the amplitudes at an adjustable value which is free of any phase-frequency characteristic. A portion of the output power of the first branch of the network is tapped through a power divider to directly control or drive the first amplifier channel. The drive control voltages required by the further amplifier channels are formed, after an appropriate phase and amplitude correction (PAK), by a linear combination of hybrid circuits in the branches of the network having the phase and amplitude characteristics required by the amplifier channels.

The limiter element may be embodied as a reverse biased semiconductor diode. The resistor or resistance having an HF voltage dependent conductivity may be embodied as a reverse biased semiconductor diode arranged in series with a constant load.

The drive control nonlinear network according to the invention utilizes an implicit processing of a signal envelope curve for driving multi-channel transmitters, to achieve an increased band width and considerably reduced circuit and production costs. Negative feedback paths are avoided while achieving a higher stability with a reduced temperature dependence as compared to prior art typical envelope curve processing and compared to high frequency negative feedback systems.

BRIEF DESCRIPTION OF THE DRAWINGS

In order that the invention may be clearly understood, it will now be described, by way of example, with reference to the accompanying drawings, wherein:

FIG. 2 is a schematic block circuit diagram of a circuit branch of the control drive network showing a limiter with an impedance inverter for achieving an increasing impedance when the limiter kicks in;

DETAILED DESCRIPTION OF PREFERRED EXAMPLE EMBODIMENTS AND OF THE BEST MODE OF THE INVENTION

Figure 1:
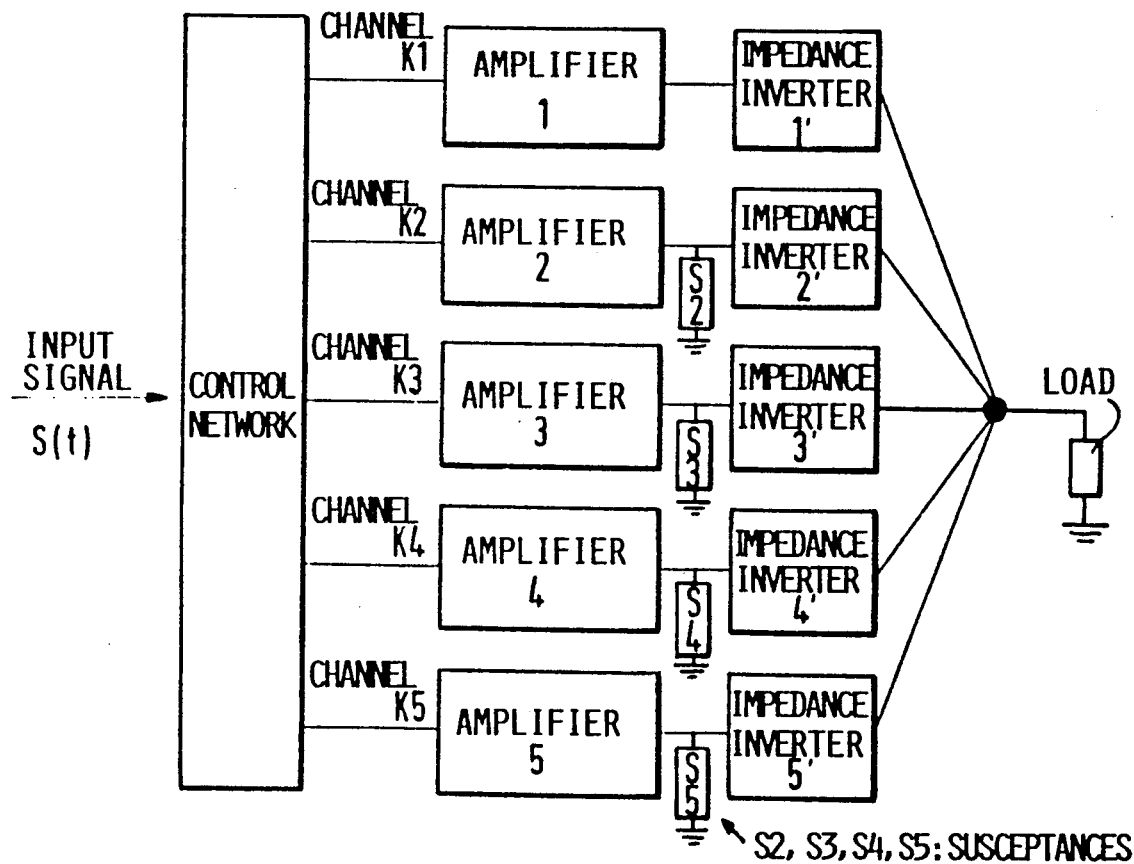
FIG. 1 is a schematic block circuit diagram of a linear amplifier with several amplifier channels driven by the nonlinear drive control network according to the invention.

FIG. 1 shows schematically the construction of a linear amplifier having several, in this example five, amplifier channels driven by the control network according to the invention.

The individual amplifiers are driven according to the invention by the nonlinear control network in such a manner, that a linear transfer function exists for the entire N-channel system and that matching of the individual amplifiers over the modulation range is optimized. The reactive loading of the individual amplifiers is compensated by shunt susceptances S2, S3, S4, S5.

Typical N-channel (Pamela) amplifiers require a drive control voltage at one channel K1, which control voltage should increase only slightly above a prescribed amplitude, that is to say, with a so-called limiter effect. In contrast thereto, the other channels K2 . . . Kn should have a nearly linear amplitude transfer function, whereby merely the phase is to be characteristically varied for larger modulations.

Figure 2:
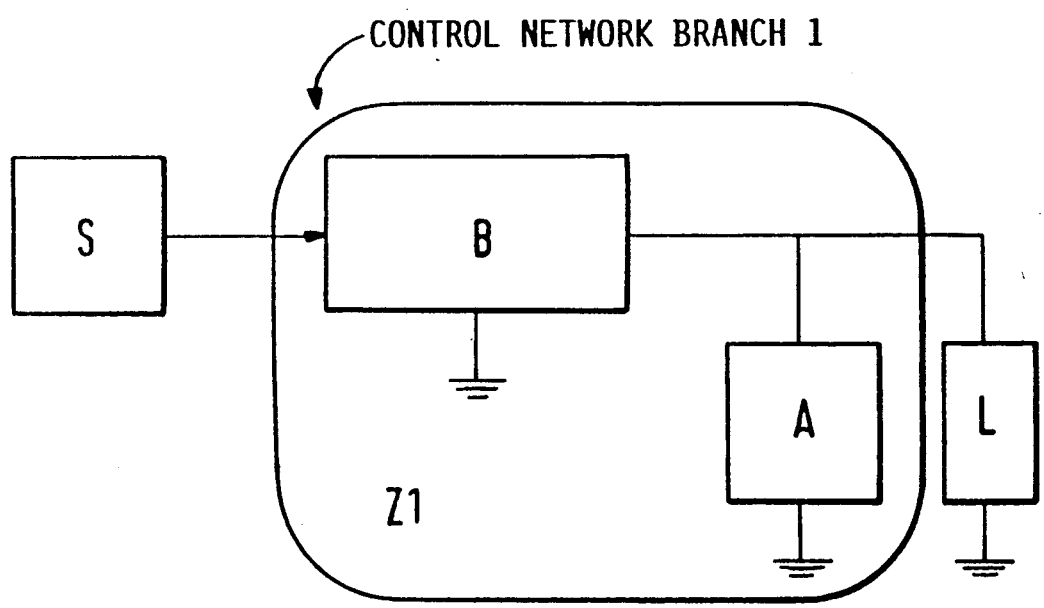
Figure 3:
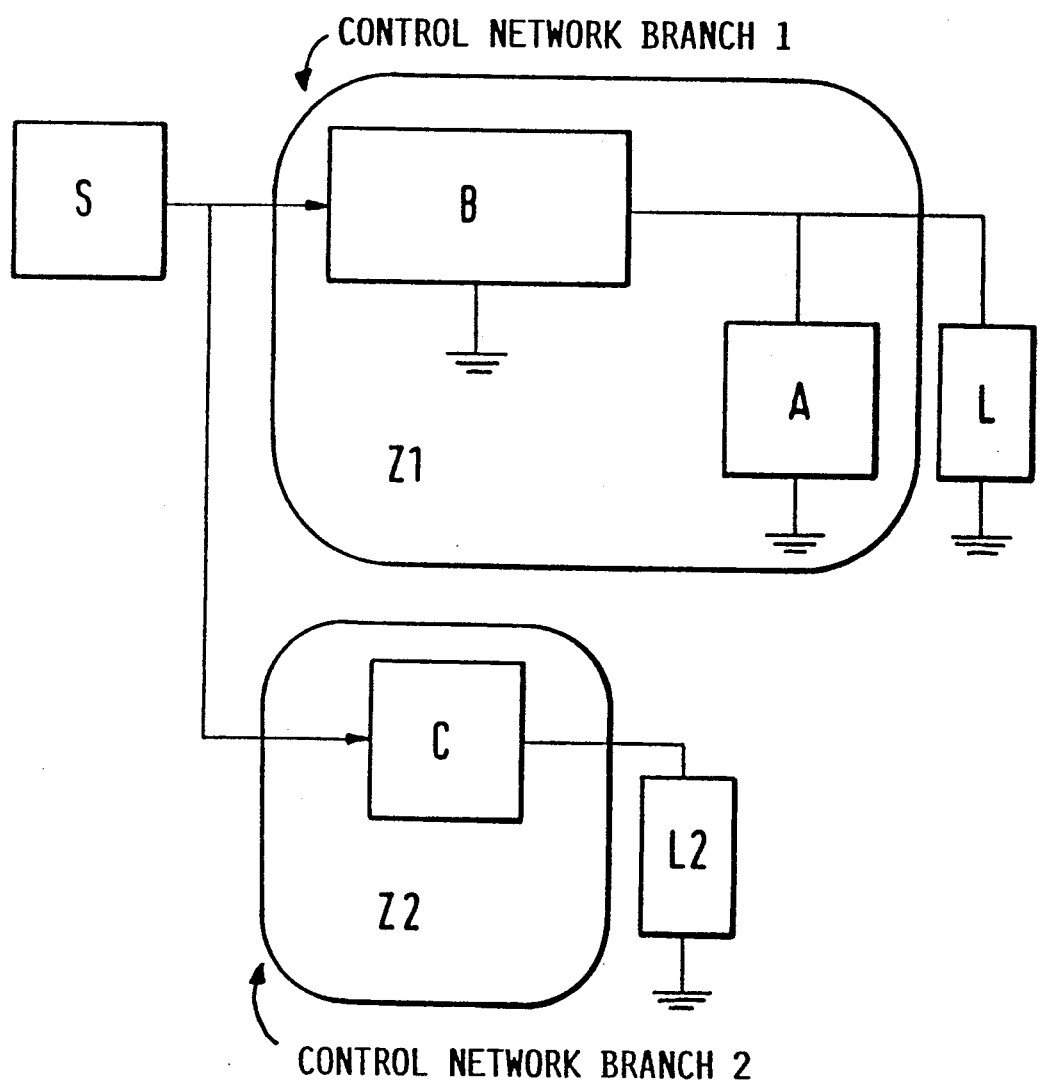
FIG. 3 is a block circuit diagram of the first and second branches of the control network showing the arrangement of a voltage dependent resistance for producing a voltage complementary to the limiter effect to apply a constant load to the signal source.

FIG. 2 schematically shows an amplitude adjustable limiter A arranged in a first branch Z1 of the control network according to the invention for solving or avoiding the problems and disadvantages of the prior art as described above. According to the invention the limiter A is not directly connected to the signal source S, but rather is coupled through an impedance inverter B which may, for example, be a λ/4 or quarter wave length line. In this manner an increasing impedance is created at the signal source S when the limiter is activated. The first branch Z1 is connected to the load L. FIG. 3 shows the combination of the first branch Z1 with a second branch Z2. A resistor C is additionally connected to the signal source S, whereby the resistance of the resistor C begins to conduct only above an adjustable HF voltage. This adjustable voltage dependent resistance C forms the second branch Z2 of the control network having a constant load impedance L2. The amplitude at the limiter A and the amplitude at the beginning of conductivity of the resistor C are correspondingly tuned to each other in such a manner that the conductivity at the signal source S which is reduced when the limiter A is activated, is compensated by the variable conductivity of the resistor C. In this manner, the load driven or "seen" by the signal source S remains constant.

Figure 4:
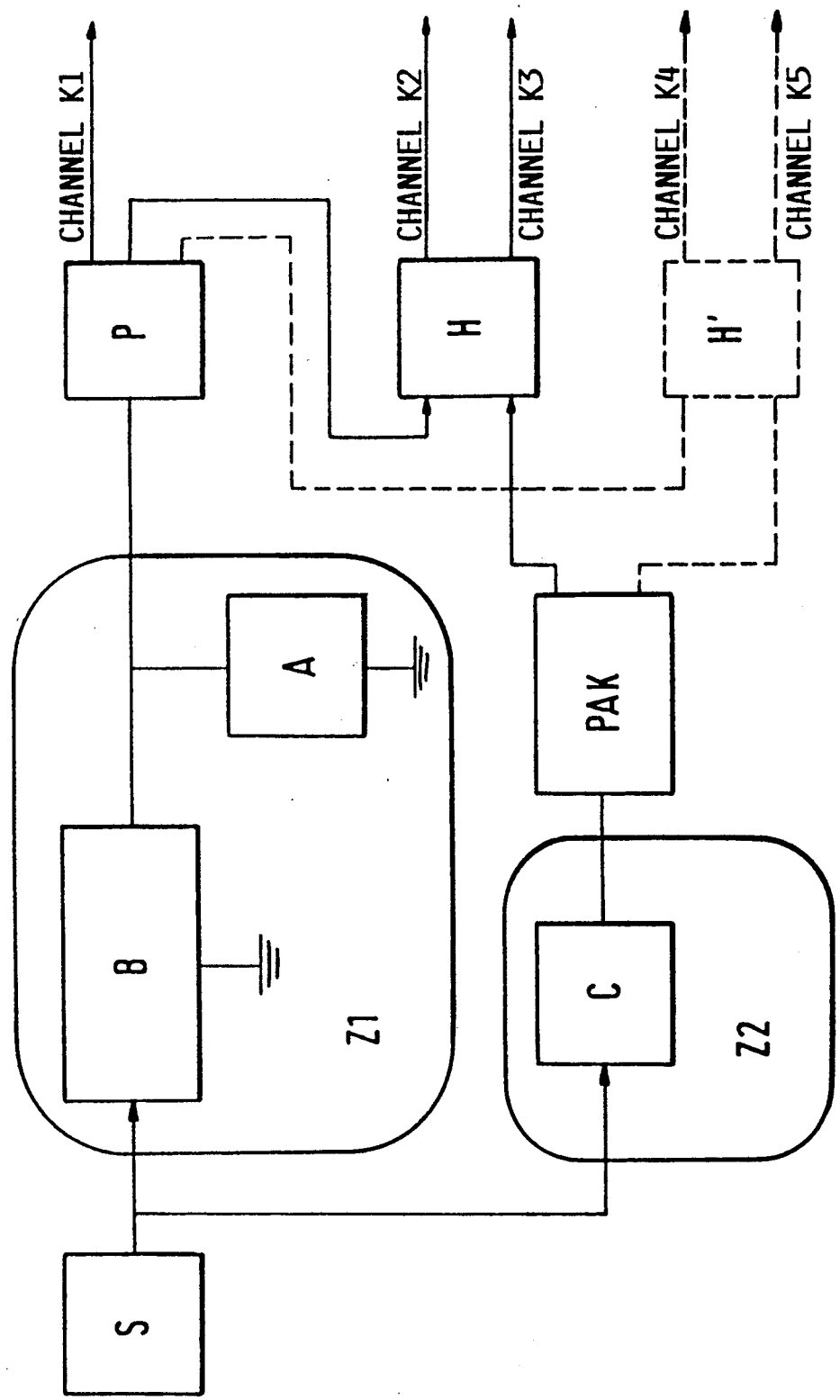
FIG. 4 is a schematic block circuit diagram of the combination of the first and second branches of the control network for generating any desired vectorial linear combination of control voltages for the individual channels by means of phase shifters, power dividers, and hybrid circuits.

As shown in FIG. 4, the drive control voltages required for the separate individual amplifier channels K1 . . . Kn, are formed of the output signals from branch Z1 and branch Z2 by appropriate linear combinations. Branch Z1 outputs a signal which is limited above a prescribed amplitude and which does not comprise any phase frequency characteristic. A portion of the power of this output signal may therefore directly be used to drive or control the first amplifier channel K1. A power divider P divides the output signal of the branch Z1 and taps off a portion of the output signal to control the amplifier channel K1. The input impedance of the power divider P represents the load L for the branch Z1 as also shown by the load block L in FIG. 3.

FIG. 4 also shows that the input control voltage signals for the other amplifier channels K2...Kn are formed of the signals from branch Z1 and branch Z2 after appropriate phase and amplitude corrections PAK by forming appropriate linear combinations of the control voltages in the hybrid circuits H and H' which comprise the phase and amplitude characteristics required by the amplifier channels K2 . . . Kn. The phase and amplitude correction PAK is achieved by means of fixed stable phase shifters and power dividers. The phase shifters may, for example be transmission line elements of varied lengths and the power dividers may, for example, be realized as hybrid circuits. Through the use of the hybrid circuits H and H' the branches Z1 and Z2 remain isolated or decoupled from each other.

Figure 5A:
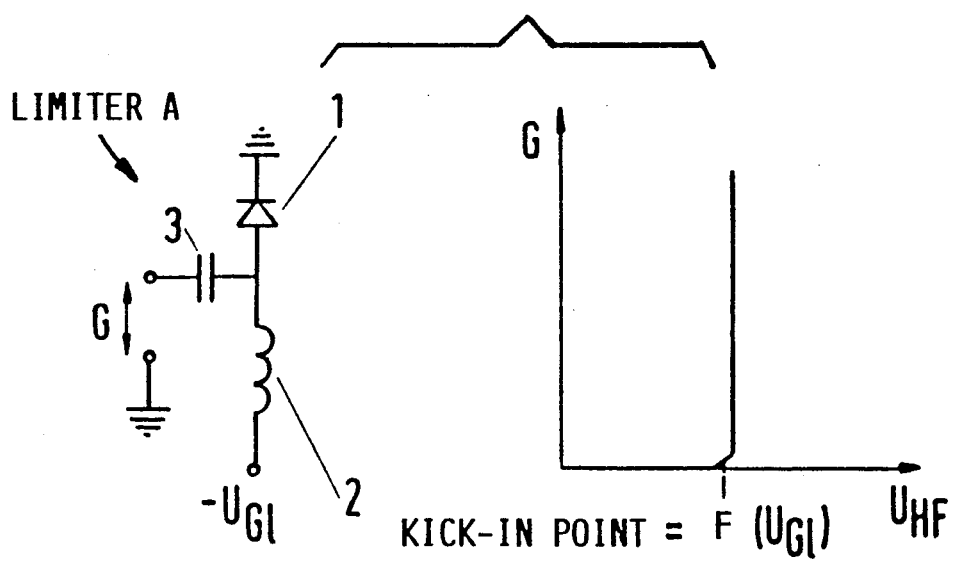
FIG. 5a is a schematic circuit diagram of a limiter with a diagram of the limiter's conductivity as a function of the HF voltage showing the kick-in point of the limiter.

As shown in FIG. 5a in the left-portion of the figure, the limiter A, having an adjustable activation point of its limiter effect, is embodied as a semiconductor diode 1 which is reverse biased by a superimposed direct voltage. A capacitance 3 and an inductance 2 decouple the direct current path from the HF signal path of the limiter A.

As long as the HF peak voltage does not exceed the constant direct voltage $U_{Gl}$ the diode remains nonconductive. However, when the HF voltage $U_{HF}$ increases to exceed the direct voltage $U_{Gl}$, the diode is driven in a forward bias whereby its conductivity G increases rapidly to prevent a further increase of the HF voltage $U_{HF}$. Thus, the high frequency voltage is limited to a peak value by the adjustably selectable direct voltage $U_{Gl}$. This limiter effect is shown in the diagram in the right portion of FIG. 5a.

Figure 5B:
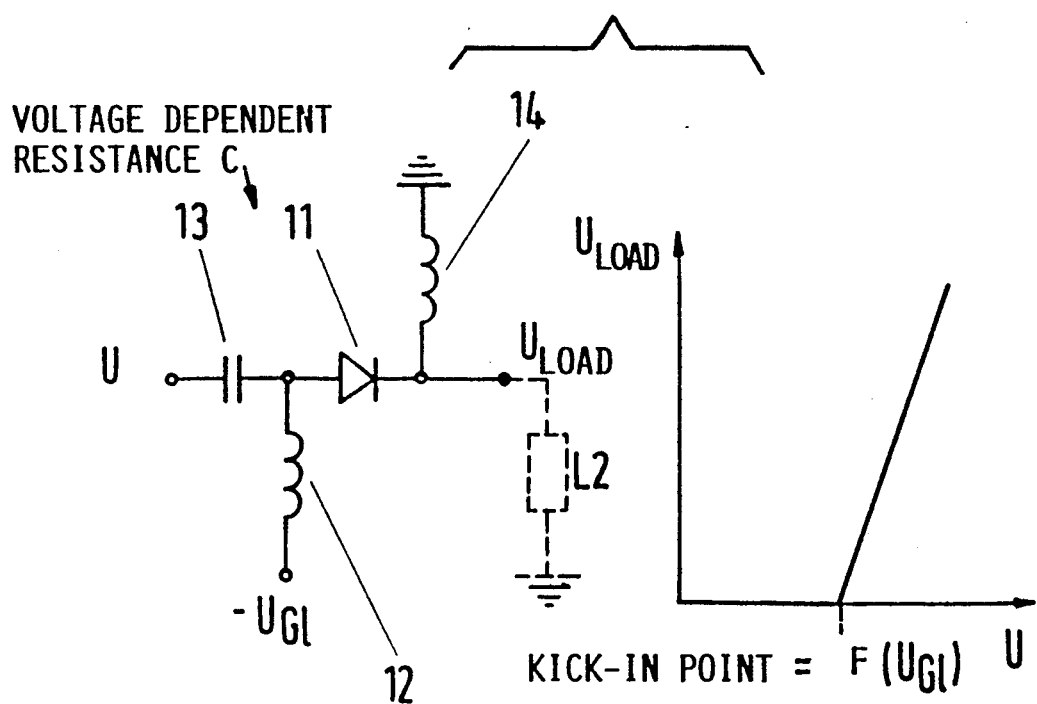
FIG. 5b is a schematic circuit diagram of a voltage dependent resistance with its diagram of the voltage across the load as a function of the input voltage showing the onset point of conductivity of the resistance.

The left portion of FIG. 5b shows an embodiment of the resistor C having a conductivity dependent on the HF voltage. A reverse biased semiconductor diode 11 is arranged in series with a constant load L2. A capacitance 13 and inductances 12 and 14 decouple the direct current path from the HF signal path of the resistor C.

The right-hand portion of FIG. 5b is a diagram showing the voltage of $U_{load}$ across a load L2 as a function of the input voltage $U_{in}$. As long as the HF peak voltage at the voltage input $U_{in}$ of the diode 11 does not exceed the direct biasing voltage $-U_{Gl}$, diode 11 remains reverse biased and no current flows to the load L2. However, as the input voltage increases and exceeds the biasing voltage, the diode 11 becomes forward biased and begins to conduct, so that an output voltage $U_{load}$ develops across the load L2, whereby the load voltage $U_{load}$ increases linearly with an increasing input voltage $U_{in}$. The constant load L2 corresponds to the constant input resistance of the PAK network as shown in FIG. 4 or by the block L2 in FIG. 3. The control network according to the invention facilitates the construction of multi-channeled high powered linear amplifiers with a minimal cost and effort. The control network can be realized to operate down to the microwave frequency range and achieves a broadband width which is not usually achievable in improved efficiency amplifiers. The through-put losses are only a few dB and are insignificant for the intended applications.

Although the invention has been described with reference to specific example embodiments, it will be appreciated that it is intended to cover all modifications and equivalents within the scope of the appended claims.

What I claim is:

1. A broadband nonlinear control network for driving linear amplifiers arranged in channels, comprising a plurality of network branches, a first branch comprising amplitude adjustable limiter means for limiting a drive signal amplitude, to an adjustable amplitude value which is free of any phase-frequency characteristic, impedance inverter means connecting said limiter means to a signal source, whereby a rising impedance is applied to said signal source when said limiter means is activated, a second branch comprising a constant load impedance and a resistor means connecting said constant load impedance to said signal source, said resistor means having a characteristic such that said resistor means becomes conductive above an adjustable high frequency threshold voltage, whereby said resistor means connects said signal source to said constant load impedance, and wherein an amplitude of a signal at said limiter means and an amplitude at said resistor means when said resistor means becomes conductive, are adjusted to each other so that a conductance, which has been reduced by an activation of said limiter means at said signal source, is compensated by a variable conductivity of the resistor means so that a load of said signal source remains constant, said first branch further comprising power divider means for branching off a portion of an output drive signal from said limiter means to drive a first channel of said amplifier channels, said control network further comprising hybrid circuit means connected to said first and second branches for producing further drive signals for further amplifier channels by a linear signal combination in said hybrid circuit means for performing a phase and amplitude correction, whereby said further drive signals have phase and amplitude characteristics required for said further amplifier channels.

2. The network of claim 1, wherein said amplitude adjustable limiter means comprise a reverse biased semiconductor diode having a characteristic with an adjustable activation point.

3. The network of claim 1, wherein said resistor means comprise a reverse biased semiconductor diode having a high frequency dependent conductivity, said constant load impedance and said reverse biased semiconductor diode being connected in series with each other.

4. The network of claim 1, wherein said first and second branches are connected in parallel with each other.

* * * * *